United States Patent [19]

Edelstein et al.

[11] 4,431,968

[45] Feb. 14, 1984

[54] METHOD OF THREE-DIMENSIONAL NMR IMAGING USING SELECTIVE EXCITATION

[75] Inventors: William A. Edelstein, Schenectady; Paul A. Bottomley, Clifton Park, both of N.Y.

[73] Assignee: General Electric Company, Schenectady, N.Y.

[21] Appl. No.: 365,229

[22] Filed: Apr. 5, 1982

[51] Int. Cl.³ .............................................. G01R 33/08
[52] U.S. Cl. ...................................... 324/309; 324/311
[58] Field of Search ................ 324/300, 307, 309, 311

[56] References Cited

U.S. PATENT DOCUMENTS 4,284,948 8/1981 Young .................................. 324/309
4,315,216 2/1982 Clow .................................... 324/309

Primary Examiner—Michael J. Tokar

Attorney, Agent, or Firm—Lawrence D. Cutter; James C. Davis, Jr.; Marvin Snyder

[57] ABSTRACT

Selective excitation is used to define a thick planar slab of excited nuclear spins in a nuclear magnetic resonance (NMR) imaging sample. The thick slab is selected such that the excited spins are contained well within the optimum sensitive region defined by the radio frequency (RF) transmitter and receiver coils. Three-dimensional spatial information of an NMR imaging parameter, such as nuclear spin density or nuclear spin relaxation time, is collected simultaneously from the excited slab and can be used to construct a series of several tomographic section images of the slab. The spatial information is encoded in the NMR signal by application of pulsed gradient magnetic fields subsequent to excitation. Image picture information is obtained from the NMR signals via three-dimensional Fourier transformation.

29 Claims, 13 Drawing Figures

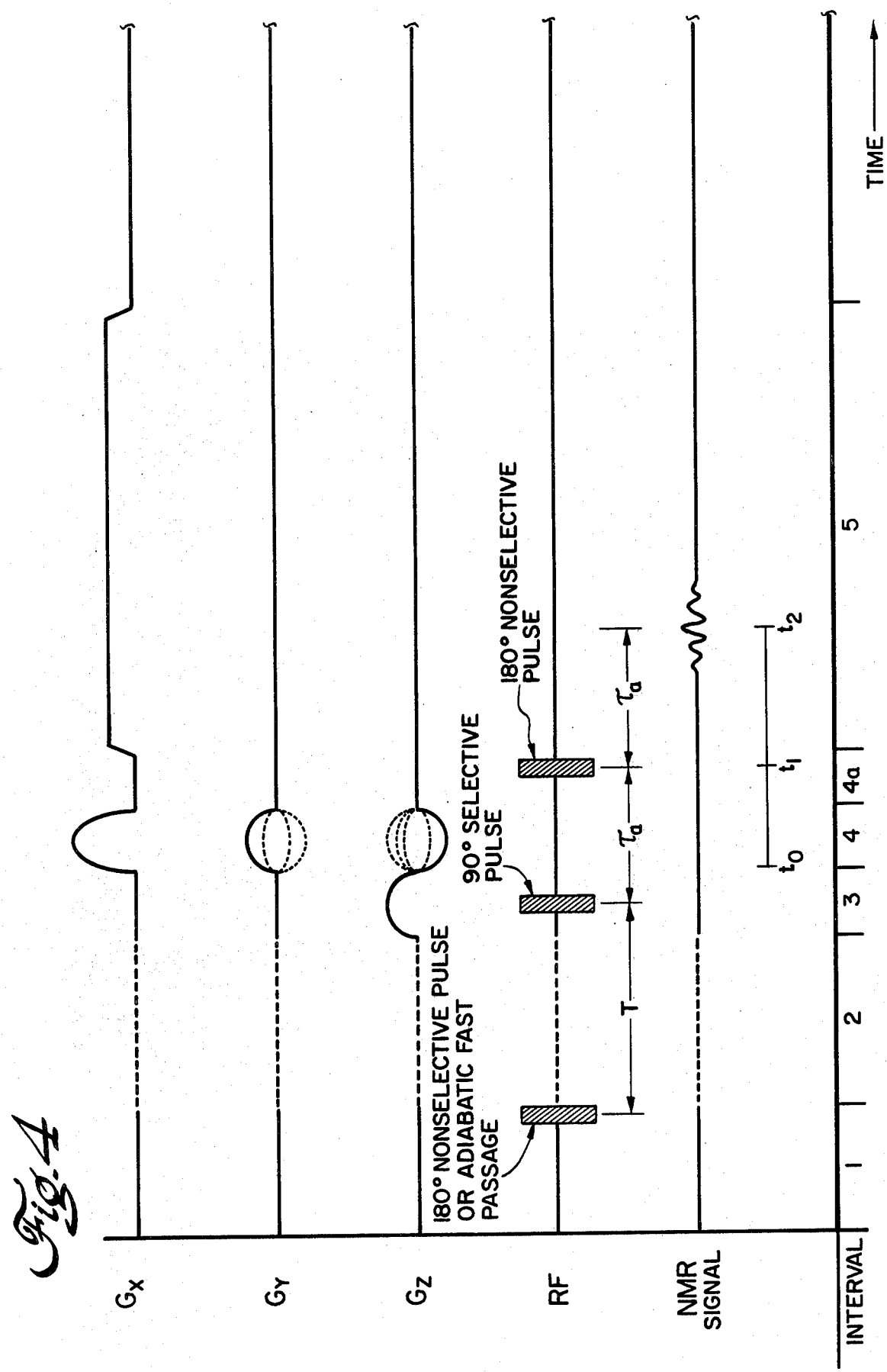

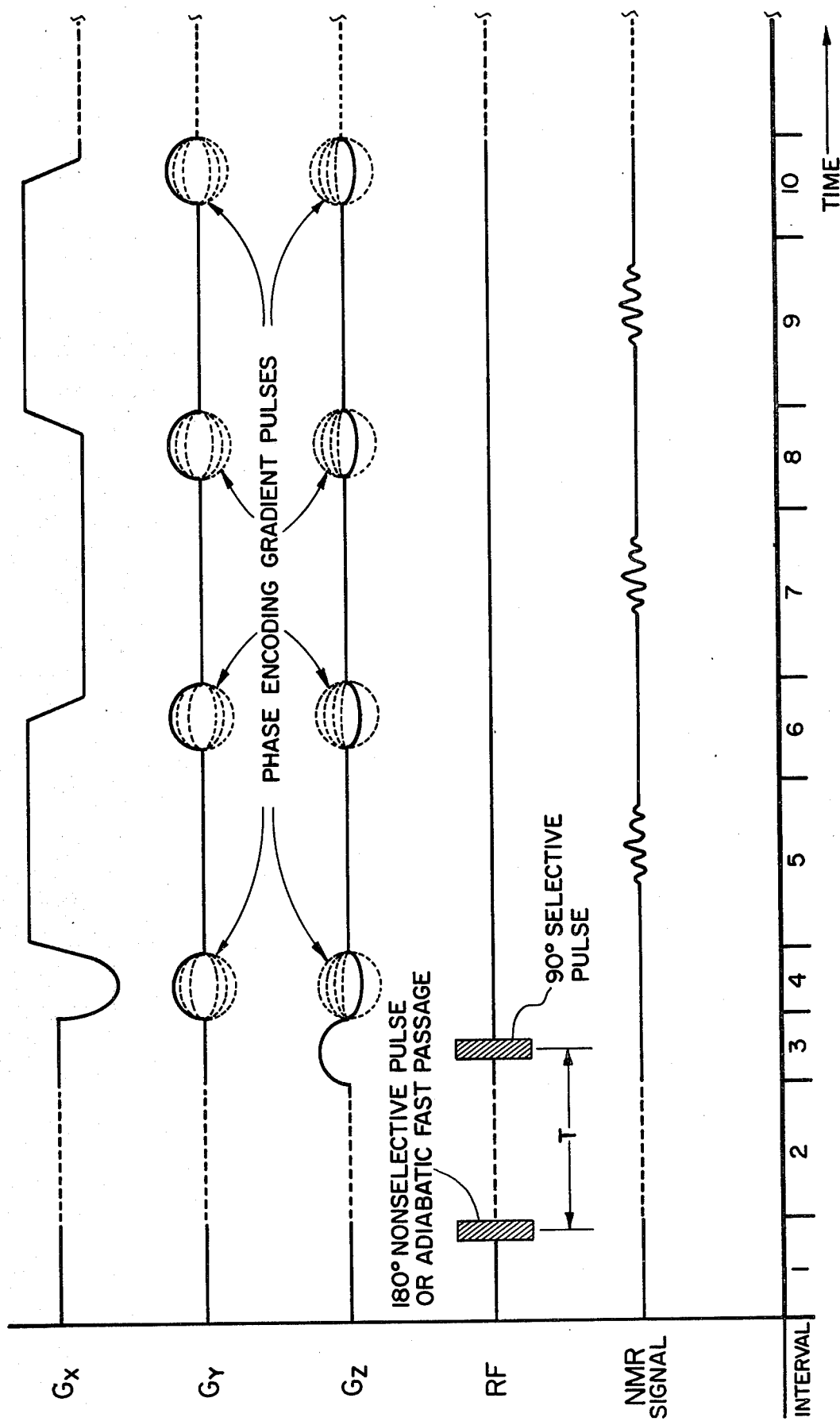

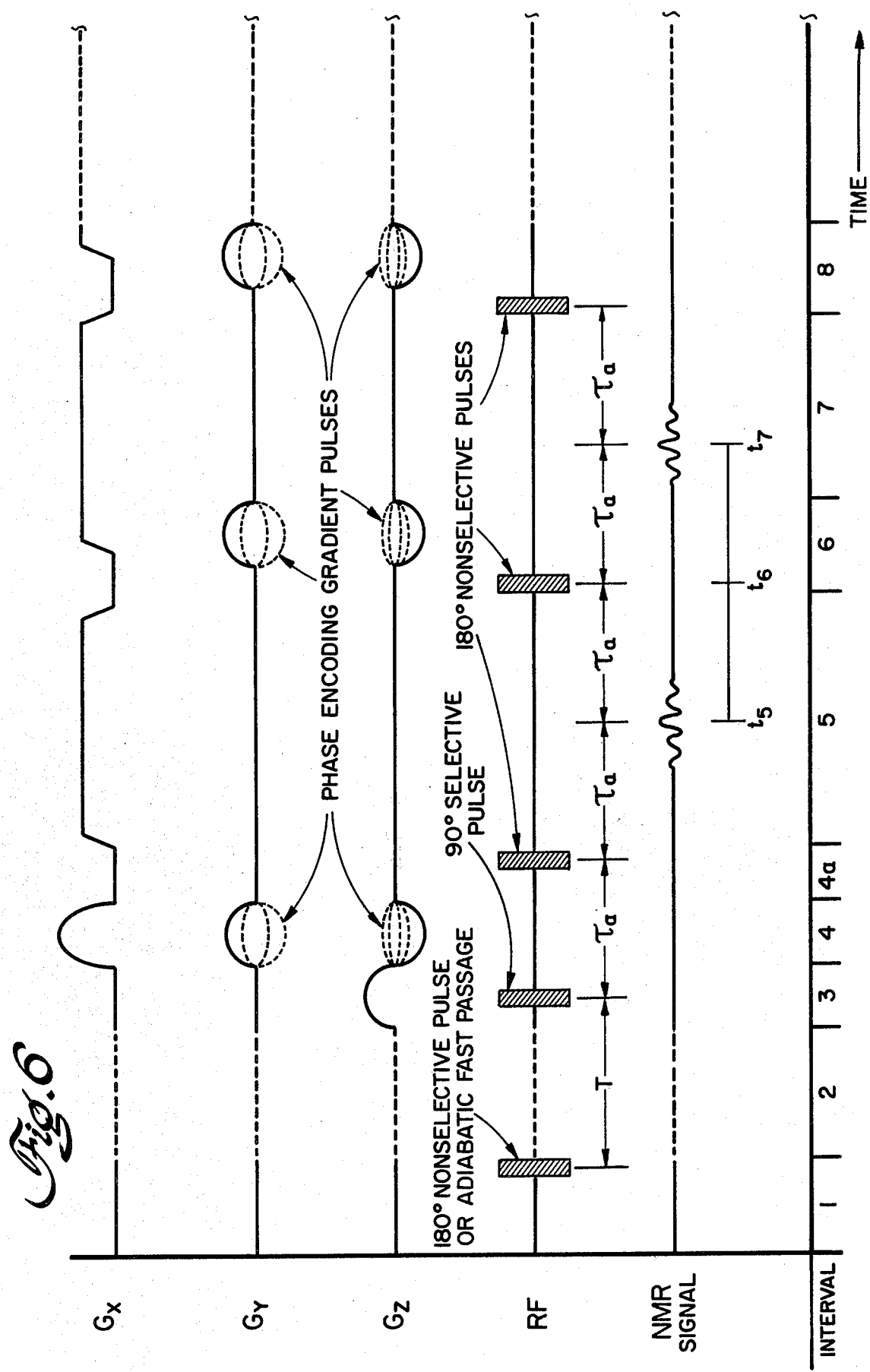

METHOD OF THREE-DIMENSIONAL NMR IMAGING USING SELECTIVE EXCITATION

BACKGROUND OF THE INVENTION

The invention relates to NMR imaging methods. More specifically, the invention relates to three-dimensional NMR imaging methods in which selective excitation is used to controllably select a thick planar slab of excited nuclear spins in a larger NMR imaging sample, and in which the spatial information needed to construct a series of several tomographic section images of the thick slab is collected simultaneously.

Several NMR imaging methods have been developed for imaging relatively thin planar regions of an imaging sample. One of the earliest methods is the sequential point method in which spatial information is gathered from one point at a time during a point-by-point scan of the entire region of interest either mechanically or electronically. A somewhat more efficient and sophisticated imaging method is the sensitive line method in which spatial information is collected simultaneously from one entire line at a time during a line-by-line scan of the region of interest, rather than from a single point at a time. Planar imaging methods are even more efficient since data are collected from an entire plane simultaneously.

In order to produce images from a three dimensional object, however, it is more efficient to gather imaging information line-by-line than point-by-point; better still, from entire planes rather than line-by-line. In NMR imaging, as in all other forms of imaging, it is desirable to gather as much information as possible in a given time. Therefore, it is even more desirable to collect information simultaneously from throughout a three-dimensional region of an imaging sample, than from a plane-by-plane scan. Probes for sensing NMR signals are generally tuned coils which are inherently sensitive to volumes, and thus NMR imaging is well suited to the acquisition of data from a three-dimensional portion of a sample. In fact, in the point, line, and planar imaging methods, considerable effort is required to restrict the data gathering process to the lesser regions of interest.

Three-dimensional NMR imaging schemes have been proposed by Richard R. Ernst in U.S. Pat. No. 4,070,611, issued Jan. 24, 1978, P. C. Lauterbur and C-M Lai, IEEE Transactions of Nuclear Science, NS-27, pp. 1227–1231 (1980), "Zeugmatography by Reconstruction from Projections"; and by P. Mansfield in U.S. Pat. No. 4,165,479, issued Aug. 21, 1979. Each of these schemes implicity assumes that the NMR imaging sample is limited in extent and contained within the region over which the tuned receiver coil is sensitive. This assumption, however, has a number of drawbacks.

One of the drawbacks is that the NMR signals from the periphery of the region over which the tuned receiver coil is sensitive may have different amplitudes or phases than NMR signals from nuclear spins at the center of the sensitive region. This results in fade-off or phase artifacts at the edge of the images or in the edge scans.

Another drawback is that the extent of the region of receiver coil sensitivity along the long axis of the human body (when acting as the imaging sample) can only be determined by the shape and strength of the applied RF fields and the shape of the receiver coil. In practice, such factors are not very effective because the RF magnetic fields cannot be produced with sharp boundaries.

In addition, the precision of the RF field shaping is limited by the small number of turns allowed in usable RF coils at NMR imaging frequencies (typically 5 MHz) for hydrogen ($^1H$) in a 0.12 Tesla static magnetic field. The number of coil turns is limited by the distributed coil inductance and capacitance which place a limit on the highest frequency at which the coil can be made to resonate.

As yet another drawback, the acquisition of the NMR signal from a large portion of the imaging sample may be too great for the dynamic range of the imaging system electronics. For example, in order to construct an NMR image, it is necessary to know the NMR signal strength in each pixel in the imaging volume, wherein a pixel (picture element) is one small fraction of the total imaging volume. If three-dimensional reconstruction is by multiple angle projection reconstruction (as it is in one known three-dimensional imaging method), then the data array would be cubic and would contain $128 \times 128 \times 128$ pixels, for instance, if the desired tomographic section image has $128 \times 128$ pixels. In three-dimensional imaging by multiple angle projection reconstruction, the resolution is the same in all directions (typically 2 mm $\times$ 2 mm), and spatial information to construct a single tomographic section image cannot be obtained unless $128 \times 128$ projections are obtained. This is necessitated by the known fact that in this imaging method, the data must be isotropic. It is impossible to do only $128 \times 128 \times 10$ projections to obtain the necessary data to construct 10 tomographic section images. Thus, the signal strength ratio (dynamic range) of one pixel to the NMR signal from the entire volume is 1 to $128 \times 128 \times 128$, or approximately 1 to $2 \times 10^6$. Additionally, because the data array is cubic, the data collecting and reconstruction processes are substantially lengthened.

In contrast, the NMR imaging method of the present invention does not require isotropic data. Image resolution in each tomographic section may be 2 mm $\times$ 2 mm in the transverse plane (i.e., orthogonal to the long axis of the imaging sample), but in the direction of the long axis can be 10 mm, which is equal to the thickness of the region imaged by each tomographic section. Compared to the resolution of the previously-described multiple angle projection reconstruction method, the resolution in the direction of the long axis is decreased by a factor of 5. This, however, decreases both the length of time necessary to gather data, as well as the length of time necessary to analyze the data to reconstruct an image. Moreover, three-dimensional spatial information is gathered only from a selected thick slab having a thickness equal to the number, $n_z$, of desired tomographic section images. In this manner, if only $n_z$ section images are desired, then only $128 \times n_z$ NMR signals are needed to obtain the necessary spatial information. If $n_z = 10$, only 1280 projections (NMR signals) are needed, as compared to $128 \times 128$ in multiple angle projection reconstruction. It is also apparent that the required dynamic range is reduced by a factor of $128/n_z$.

SUMMARY OF THE INVENTION

A method of three-dimensional NMR imaging uses selective excitation to excite a thick planar slab of nuclear spins in an imaging sample situated in a static magnetic field. The imaging information for constructing a series of tomographic section images of the thick planar slab is collected simultaneously. Initially, nuclear spins in the thick planar slab are excited by the simultaneous application of a magnetic field gradient along a first axis of the imaging sample and a frequency selective pulse. This is followed by the simultaneous application of orthogonal magnetic field gradient pulses to introduce spatial localization in the NMR signal. The NMR signal is observed in the presence of an imaging gradient having a constant direction so that the observed NMR signal, upon Fourier analysis, is a projection of the spatial information from throughout the thick slab in the direction of this gradient. The NMR signal is sampled in quadrature a number of times according to the number of pixels in the direction of the imaging gradient.

It is an object of the invention to provide an improved three-dimensional NMR imaging method in which imaging information is obtained simultaneously from a selected and controlled volume of an NMR imaging sample.

It is another object of the invention to provide an improved three-dimensional NMR imaging method in which the dynamic range can be controlled by adjusting the thickness of the selected volume.

It is still another object of the invention to provide an improved three-dimensional NMR imaging method in which the data collecting and reconstruction times are shortened.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 4 illustrates an improved NMR pulse sequence, resulting from use of the invention for three-dimensional imaging, which overcomes the effect of static magnetic field inhomogeneity.

FIG. 5 depicts an NMR pulse sequence produced by the invention and which is similar to that shown in FIG. 2, but in which spin echoes are used to shorten the time needed to collect the imaging information.

FIG. 6 depicts an NMR pulse sequence produced by the invention and which is similar to that illustrated in FIG. 4, but in which spin echoes are used to shorten the time needed to collect the imaging information, as well as to overcome the effect of static magnetic field inhomogeneity.

DETAILED DESCRIPTION OF THE INVENTION

Figure 1:
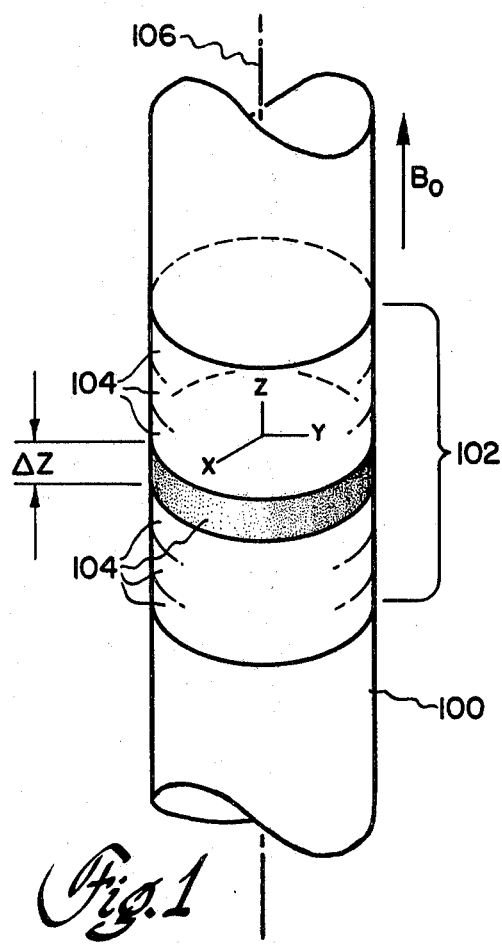
FIG. 1 illustrates an NMR imaging sample situated in a static magnetic field and having a thick planar slab defined therein by selective excitation.

The NMR imaging pulse sequences produced by the invention will be best understood if initial reference is made to FIG. 1, which depicts an imaging sample 100 situated in a static homogeneous magnetic field $B_o$ directed in the positive Z-axis direction of the Cartesian coordinate system. The Z-axis is selected to be coincident with the long or cylindrical axis 106 of sample 100. The origin of the coordinate system is taken to be the center of the imaging sample, which is also at the center of a thick planar slab or imaging volume 102 selected by the selective excitation method as will be described hereinafter. Thinner planar slices 104 correspond to a series of tomographic images obtainable upon analysis of the spatial information. Typically, thickness $\Delta z$ of a planar slice 104 is approximately 2 to 15 millimeters.

The effect of static magnetic field $B_o$ is to polarize nuclear spins having net magnetic moments so that a greater number of nuclear spins align with the $B_o$ field and add to produce a macroscopic magnetization M. This polarization allows the resonance phenomenon to be excited. Individual polarized nuclear spins, and hence magnetization M, resonate (or process about the axis of field $B_o$) at a frequency $\omega$ given by the equation $$\omega = \gamma B_o \quad (1)$$

in which $\gamma$ is the gyromagnetic ratio (constant for each type of isotope). The value of $\gamma$ for hydrogen ($^1$H) is about 4.26 KHz/gauss. $^1$H is ubiquitous in living tissue and exhibits a stronger NMR signal as compared to nitrogen ($^{14}$N), phosphorus ($^{31}$P), carbon ($^{13}$C), sodium ($^{23}$Na), an oxygen ($^{17}$O), which are some of the other species present. For this reason, spatial nuclear spin distribution of naturally occurring hydrogen is commonly used in NMR imaging.

Generally, the static magnetic field $B_o$ is applied during the entire sequence of NMR imaging pulses, and accordingly is omitted from all of the figures depicting NMR pulse sequences.

It is beneficial to initially consider the roles in NMR imaging of magnetic field gradients and RF magnetic field pulses.

Magnetic field gradients are necessary to encode spatial information into the NMR signal. If a magnetic field gradient along an imaging volume is a function of position, then so is the resonant frequency $\omega$. In fact, if the imaging gradient is linear, the frequency spectrum is a one-dimensional projection of the NMR signal distribution along the direction of the gradient. Typically three orthogonal magnetic field gradients $$G_x(t) = \partial B_o / \partial x \quad (2)$$

$$G_y(t) = \partial B_o / \partial y \quad (3)$$

$$G_z(t) = \partial B_o/\partial z \quad (4)$$

are used. The $G_x$, $G_y$, and $G_z$ gradients are constant throughout the imaging volume 102, (FIG. 1), but their magnitudes are typically time dependent. The magnetic fields associated with the gradients are denoted, respectively, $b_x$, $b_y$, and $b_z$, wherein $$b_x = G_x(t)x \quad (5)$$

$$b_y = G_y(t)y \quad (6)$$

$$b_z = G_z(t)z \quad (7)$$

within the imaging volume.

RF magnetic field pulses are used in NMR imaging to excite the nuclear spins to resonance. The frequency of the RF pulse needed to induce resonance is the same as the precession frequency $\omega$ defined by equation (1). In the ensuing discussion, reference will be made to 90° RF pulses and 180° RF pulses. Briefly, a 90° RF pulse causes magnetization M to rotate 90° about the axis defined by the applied RF magnetic field vector in a frame of reference rotating at the resonant frequency $\omega$ about the Z-axis relative to the laboratory frame of reference. Thus, if the positive Z-axis direction is assumed to be the direction of static magnetic field $B_o$, a 90° RF pulse will cause magnetization M along $B_o$ to rotate into the transverse plane defined by the X- and Y-axis, for example. Similarly, a 180° RF pulse causes magnetization M to rotate 180° about the axis defined by the applied RF magnetic field vector in the frame of reference rotating at the resonant frequency $\omega$ about the Z-axis relative to the laboratory frame of reference (e.g., from the positive Z-axis direction to the negative Z-axis direction). The inverting effect of a 180° RF pulse on magnetization M along $B_o$ can also be obtained by a technique known as an adiabatic fast passage. The RF magnetic field pulses are applied in the transverse plane, e.g., along the X-axis.

A more complete treatment of basic NMR concepts is provided in Thomas C. Farrar and Edwin D. Becker, "Pulse and Fourier Transform NMR, Introduction of Theory and Methods", Academic Press, New York (1971), which is incorporated herein by reference as background material.

Figure 2:
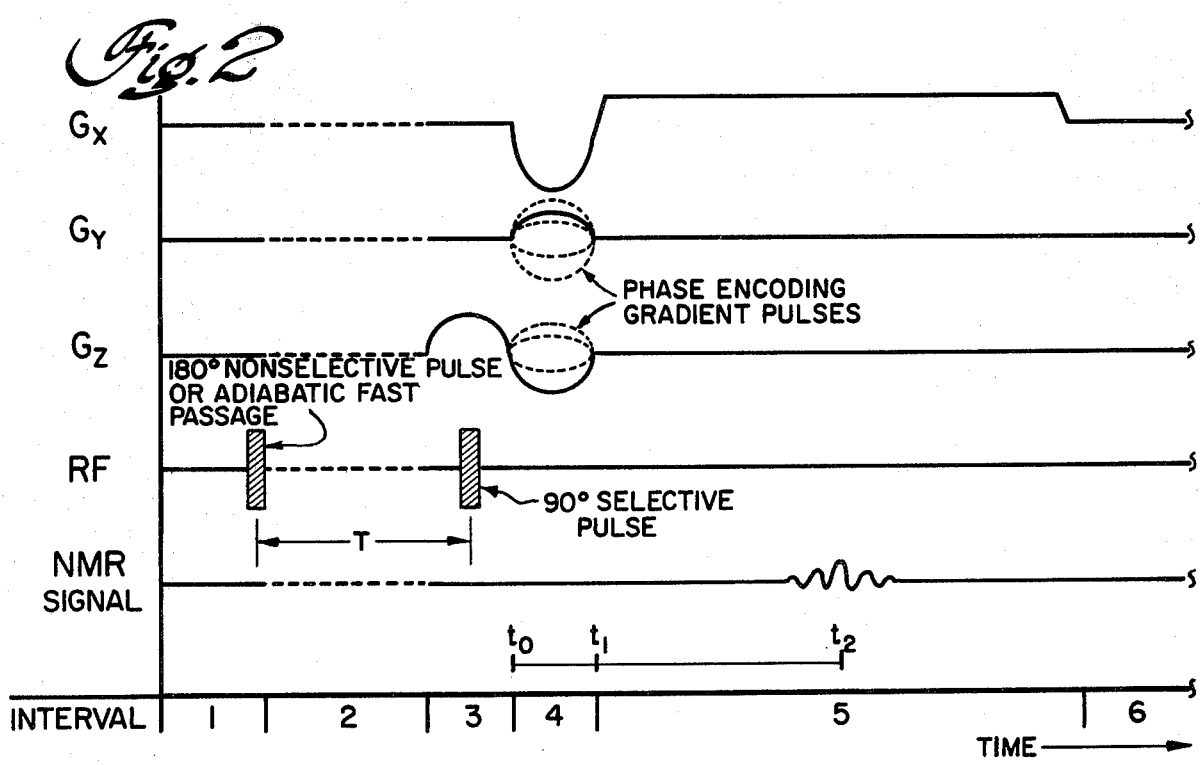
FIG. 2 illustrates an NMR pulse sequence produced by invention, suitable for three-dimensional imaging.

Reference is now made to FIG. 2 which depicts one NMR pulse sequence in accordance with the present invention. Selection of thick planar slab 102 (FIG. 1) and the excitation of nuclear spins therein will be discussed first beginning with interval 3 shown along the horizontal axis in FIG. 2. During interval 3, imaging sample 100 is subjected to a positive magnetic field gradient $G_z$ so that the imaging sample is subjected to a total magnetic field in the Z-axis direction composed of the magnetic field gradient $G_z$ and static magnetic field $B_o$. Approximately at the midpoint of interval 3, sample 100 is irradiated with a selective 90° RF pulse. The frequency content of the 90° RF pulse is selected so as to preferentially excite nuclear spins in thick slab 102 in which the magnetic field strength is as predicted by equation (1). Nuclear spins outside region 102 remain substantially unaffected by the RF pulse. The "selective" nature of the 90° RF pulse is thus apparent.

The 90° RF pulse is preferably a carrier amplitude modulated by (sin bt)/bt, in which t is time and b is a constant. In this case the thickness profile of thick planar slab 102 is substantially rectangular. Alternatively, other frequency selective 90° RF pulses can be used, provided the resulting thick planar slab has a substantially rectangular profile.

The frequency bandwidth of the 90° RF pulse is determined by the number of tomographic section images 104 that are desired. If only 10 section images are desired, the bandwidth is selected so as to excite nuclear spins in thick planar slab 102 which is about 20 to 150 millimeters thick (10 sections×2–15 mm/section).

In interval 4 a negative $G_x$ magnetic field gradient is applied to dephase the nuclear spins in the X-axis direction by a predetermined amount. The positive imaging magnetic field gradient $G_x$ applied in interval 5 reverses the direction of nuclear spin dephasing, so that the nuclear spins again rephase and produce a complete spin echo signal (interval 5) which can be observed at a time when the $G_x$ magnetic field gradient is constant. In the absence of the negative $G_x$ lobe in interval 4, the NMR signal would occur at some time near the end of interval 4 and the beginning of interval 5. It would be difficult to obtain useful spatial information from such an NMR signal because there would be a finite time period when imaging gradient $G_x$ is transient and its exact strength unknown. The resulting spatial information would be badly distorted and could not be normally used.

Figures 3A, 3B:
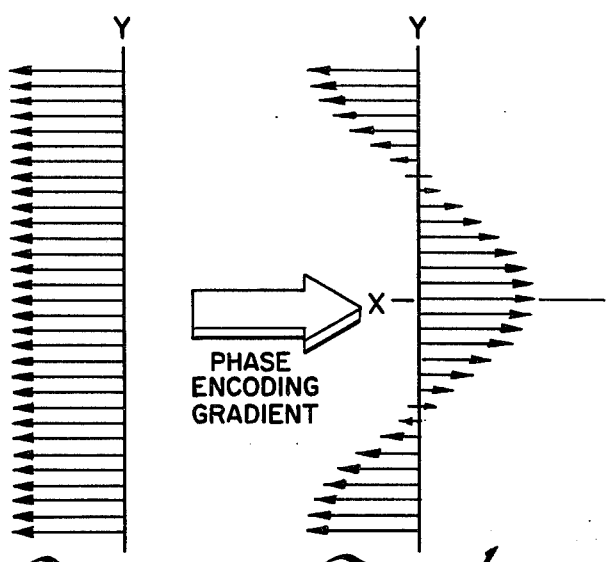
FIG. 3a illustrates schematically a column of nuclear spins aligned in the Y-coordinate direction in the thick planar slab depicted in FIG. 1.
FIG. 3b illustrates schematically the phase changes imposed upon the column of nuclear spins shown in FIG. 3a, resulting from the application thereto of a phase encoding gradient.

Contemporaneously with the application of the negative $G_x$ magnetic field gradient lobe in interval 4, a phase encoding magnetic field gradient $G_y$ lobe having one of $n_y$ different amplitudes (as indicated by the dashed lines) is also applied. The $G_y$ gradient encodes spatial information in the Y-axis direction by introducing a twist in the orientation of the nuclear spins by a multiple of $2\pi$. By way of illustration, FIG. 3a shows the profile of nuclear spins (nutated by 90° from the positive Z-axis direction) before the application of the phase encoding $G_y$ gradient. Following the application of the first $G_y$ gradient, the nuclear spins are twisted into a one-turn helix, as shown in FIG. 3b. Each different amplitude of gradient $G_y$ introduces a different degree of twist (phase encoding). The number, $n_y$, of $G_y$ gradient amplitudes is chosen to be equal to the number of pixels the reconstructed tomographic section image will have in the Y-axis direction. The pulse sequences of intervals 3, 4, and 5 are repeated for $n_y$ different amplitudes of gradient $G_y$ to produce $n_y$ spin echo signals in interval 5. In practice, signals are averaged several times prior to advancing the $G_y$ gradient in order to improve the signal-to-noise ratio. Typically, $n_y$ is 128 or 256.

The $G_z$ magnetic field gradient in interval 4 is a sum of two components, as defined hereinafter. The first $G_z$ component is a negative $G_z$ lobe which is necessary to rephase throughout slab 102 (FIG. 1) the nuclear spins excited in interval 3 (FIG. 2). The rephasing is necessary because although the excited nuclear spins precess at the same frequency, they have different phases resulting in a degradation of the NMR signal. The positive $G_z$ lobe in interval 3 is related to the rephasing $G_z$ lobe in interval 4 as follows:

$$\int_4 dt G_z = -\tfrac{1}{2} \int_3 dt G_z \quad (8)$$

in which $\int_4$ is the integral of the waveform of gradient $G_z$ over interval 4 and $\int_3$ is the integral of the waveform of gradient $G_z$ over interval 3.

The second component of gradient $G_z$ in interval 4 is a phase encoding lobe which makes it possible to phase encode spatial information throughout the thickness of slice 102 (i.e., in the Z-axis direction, FIG. 1).

The $G_z$ magnetic field gradient is shown in interval 4 as a single $G_z$ lobe because the action of the two components is linearly independent and therefore can be added to form a sum which performs both the rephasing and the phase-encoding actions simultaneously. The amplitude of magnetic field gradient $G_z$ is maintained constant in interval 4 while magnetic field gradient $G_y$ is advanced through $n_y$ amplitudes. Following the observation of $n_y$ spin echo signals, the pulse sequences of intervals 3, 4, and 5 are repeated with a different amplitude (as indicated by the dashed lines) of the phase encoding $G_z$ gradient. The number of amplitudes of the $G_z$ gradient, $n_z$, is equal to the number of tomographic sections 104 (FIG. 1). The number of spin echo signals necessary to obtain the spatial information necessary for $n_z$ section images is $(n_y) \cdot (n_z)$.

Spatial discrimination in the X-axis direction is provided by observing the spin echo signal in interval 5 in the presence of an imaging $G_x$ magnetic field gradient which rephases the nuclear spins dephased by the negative $G_x$ gradient lobe in interval 4. In order for the rephasing to occur, the $G_x$ gradients in intervals 4 and 5 (FIG. 2) are selected such that:

$$\int_{t_0}^{t_1} G_x dt = \int_{t_1}^{t_2} G_x dt. \quad (9)$$

The spin echo signal is sampled (in quadrature) $n_x$ times in interval 5, wherein $n_x$ is equal to the number of pixels the tomographic section image has in the X-axis direction (typically, $n_x = n_y$). The observed spin echo signal represents a projection of spatial information from throughout the entire thick slab 102 onto the X-axis.

Thus, thick slab 102 is divided into $n_x \cdot n_y \cdot n_z$ pixels which are obtained by known three-dimensional discrete Fourier analysis techniques. The $n_x \cdot n_y \cdot n_z$ pixels, once obtained, can also be used to produce a planar image at any angle through the thick planar slab.

The pulse sequence described above yields spatial information of the relative nuclear spin distributions. The signal is referred to as S1 and contains mostly information of the hydrogen nuclear spin density distribution. If the entire pulse sequence shown in FIG. 2 is performed, beginning with a 180° RF pulse (or an adiabatic fast passage) in interval 1 at an interval T prior to the application of the positive $G_z$ magnetic field gradient in interval 3, then the signal observed in interval 5 contains both nuclear spin density and $T_1$ relaxation time information (described hereinafter). This signal is called S2. An approximate distribution of the $T_1$ values can be calculated from the formula $$T_1 = T/\ln(2S1/S1-S2) \quad (10)$$

Another method for obtaining nuclear spin density and $T_1$ information is to repeat the pulse sequence (intervals 3, 4, and 5 only) at a repetition period which is on the order of, or less than, the $T_1$ relaxation time of the imaging sample. $T_1$ can range from between about 0.03 and 3 seconds, with 0.3 being typical for imaging the human body. The repetition period may thus be between about 0.03 and 3 seconds, but preferably is between about 0.1 and 1 second. This provides for the attenuation or saturation of those $T_1$ components in the imaging sample with the longer $T_1$ relaxation times relative to the shorter components.

Information concerning the spatial distribution of $T_1$ values may also be obtained by repeating the pulse sequence, as shown in FIG. 2 (intervals 1-5), at a repetition period of between about 0.03 and about 3 seconds, but preferably between about 0.1 and 1 second. The pulse sequence is repeated rapidly so that the magnetization does not have time to return to its equilibrium between sequences.

By way of background, $T_1$ is referred to as "spin lattice" or "longitudinal" relaxation time. $T_1$ describes the process of nuclear spin return to equilibrium; i.e., the tendency of nuclear spins to realign with the static magnetic field $B_o$ after cessation of RF excitation. The rate of return to equilibrium is dependent on how fast energy can be transferred to surrounding material (also known as the lattice). $T_1$ can vary from a few milliseconds in liquids to minutes or hours in solids. In biological tissue, the typical range is from about 30 milliseconds to 3 seconds.

The $T_1$ relaxation time, as well as another relaxation time $T_2$ (described below), of biological tissue differ according to type, age, and health of the tissue, thus providing inherent contrast mechanisms for soft tissue discrimination in NMR images and thereby enabling detection of various abnormal tissue conditions.

$T_2$, the transverse relaxation time or "spin-spin" relaxation time, is a measure of how long excited nuclear spins oscillate in phase. After a RF pulse, the nuclear spins are in phase and process together. Each nuclear spin behaves like a magnet which generates a magnetic field that affects other spinning nuclei in its vicinity (spin-spin interaction). As each spin experiences slightly different magnetic fields, it precesses at a different rate and dephases with respect to the other spins, reducing the observed NMR signal. $T_2$ can vary from a few microseconds in solids to seconds in liquids and is always less than or equal to $T_1$. In biological tissue the range is about 5 milliseconds to 3 seconds.

If the magnetic field $B_o$ itself has inherent inhomogeneities (as is often the case in practical magnets), these produce additional dephasing which hasten the decay of the NMR signal. This is because nuclear spins in different spatial positions are exposed to slightly different magnetic field values and hence resonate at slightly different frequencies. This new decay time, which includes the effects of magnet inhomogeneities, is designated $T_2^*$ ($T_2$ star), where $T_2^* \leq T_2$.

NMR imaging techniques for overcoming $T_2^*$ effects in planar NMR imaging are described and claimed in application Ser. No. 345,444, filed Feb. 3, 1982, filed by the same inventors as herein and assigned to the same assignee as the present invention. This application is incorporated herein by reference.

Reference is now made to FIG. 4 which illustrates a pulse sequence for overcoming $T_2^*$ effects in three-dimensional NMR imaging methods. The pulse sequence is similar to that illustrated in FIG. 2, with some important exceptions. Notably, in interval 4 of FIG. 4, the negative dephasing lobe of magnetic field gradient $G_x$ (FIG. 2) is replaced by a positive dephasing $G_x$ magnetic field gradient lobe, and a 180° RF nonselective inverting pulse is applied during interval 4a (FIG. 4), following a short wait of between about 0.1 and 1 millisecond to allow currents in the gradient coil windings to subside. The 180° RF pulse is applied at a end of an interval $\tau_a$ following the application of the 90° RF pulse in interval 3, wherein $\tau_a$ is the time between the mean application of the 90° RF pulse and the mean application of the 180° RF pulse and is typically about 5 milliseconds. The effect of the 180° RF pulse is to reverse the direction of dephasing of nuclear spins dephased by the $T_2^*$ process so that a first spin echo occurs at the end of interval $\tau_a$ following the application of the 180° RF pulse. The 180° RF pulse will also induce a second spin echo to occur from the dephasing and rephasing of the spins produced by gradient $G_x$. The time of occurrence of the second spin echo is dependent on the degree of the initial dephasing in interval 4. Thus, in order to overcome the effects of $T_2^*$, it is necessary to adjust the magnitude of the $G_x$ gradient dephasing pulse applied during interval 4 such that the second spin echo signal also occurs at the end of interval $\tau_a$ following the application of the 180° RF pulse. The use of the 180° RF pulse in combination with the rephasing gradient results in coincident rephasing of the spin echo signals to produce a composite NMR signal, as shown in interval 5.

In order for the two spin echoes to coincide, the integral of the $G_x$ gradient waveforms in intervals 4 and 5 (FIG. 4) must satisfy the condition that $$\int_{t_0}^{t_1} G_x dt = \int_{t_1}^{t_2} G_x dt. \quad (11)$$

Although magnetic field gradient $G_x$ is depicted in interval 4 as the positive half of a sinusoid, it can be of any shape, provided equation (11) is satisfied. For example, gradient $G_x$ could have either a Gaussian or rectangular configuration.

The pulse sequence of FIG. 4 may be used to obtain nuclear spin and $T_1$ spatial distribution information, in a manner similar to that described heretofore with respect to FIG. 2, by the application of either a 180° RF nonselective inverting pulse or an adiabatic fast passage in interval 1, or by the repetition of the pulse sequence beginning with interval 3. $T_1$ information alone may be obtained by repeating the entire pulse sequence beginning with interval 1 in the manner previously described. Furthermore, $T_2$ spatial distribution may be obtained by adjusting interval $\tau_a$ (between the 90° RF pulse and the 180° RF pulse) of the pulse sequence comprising intervals 3, 4, 4a, and 5 such that $\tau_a$ is on the order of $T_2$ of the imaging sample. Time $\tau_a$ may be adjusted between 2 and 1500 milliseconds with a typical value being 30 milliseconds. This provides for the attenuation of the nuclear spin echo according to $T_2$ relaxation time in the sample, thus providing a $T_2$ image. Combined $T_1$ and $T_2$ imaging information may be obtained either by adjusting, in the entire pulse sequence shown in FIG. 4, intervals T and $\tau_a$, or by adjusting the repetition period between the pulse sequence beginning with interval 1 and interval $\tau_a$ within the time limits specified hereinbefore. $T_1$ and $T_2$ information may also be obtained by adjusting $\tau_a$ to yield $T_2$ information and repeating the sequence beginning with interval 3 to obtain $T_1$ information. The resulting pulse sequences provide a spin echo signal containing both $T_1$ and $T_2$ imaging information.

The spatial information gathering process can be speeded up by the use of the pulse sequences depicted in FIGS. 5 and 6. Intervals 1-5 of FIG. 5 are substantially identical to like numbered intervals of FIG. 2, while intervals 1, 2, 3, 4, 4a, and 5 of FIG. 6 are substantially identical to like numbered intervals in FIG. 4.

Referring first to FIG. 5, the important features are the reversal of $G_x$ to produce a plurality of spin echoes, and the application of various phase encoding gradients $G_z$ and $G_y$ in addition to those in interval 4 which also appeared in FIG. 2.

The sequence shown in FIG. 5, for example, can be used as an improvement on the sequence shown in FIG. 2 (without applying the pulse encoding gradients $G_y$ and $G_z$ in intervals 6, 8, 10, etc.) by simply adding up the spin echoes (produced by the reversals of $G_x$) in intervals 7, 9, etc., taking care to time-reverse alternate echoes before adding, to improve the signal-to-noise ratio. If n echoes are gathered, then the signal-to-noise ratio will be improved by a factor of approximately $\sqrt{n}$ up to the point where the echo signals become significantly attenuated because of $T_2$ decay.

The $G_y$ and $G_z$ phase encoding gradients in intervals 6, 8, 10, etc., can be used to shorten the data collection time. In order to obtain the necessary spatial information to produce an image with $n_x \cdot n_y \cdot n_z$ pixels, it is necessary to gather at least $n_y \cdot n_z$ signals. Each of these signals must correspond to a unique pair of integers, for example, $k_y$, $k_z$, such that $$-n_y/2 \leq k_y \leq n_y/2 - 1, \quad -n_z/2 \leq k_z \leq n_z/2 - 1 \quad (12)$$

and $$S(x,y,z,k_y,k_z,t) = S(x,y,z,0,0,t) \exp i\,\phi_y \exp i\,\phi_z \quad (13)$$

where $S(x,y,z,k_y,k_z,t)$ is the NMR signal originating from the image sample at point (x,y,z) characterized by integers $k_y$, $k_z$ with $$\phi_y = \frac{2\pi k_y y}{L_y}, \quad \phi_z = \frac{2\pi k_z z}{L_z} \quad (14)$$

In equations 13 and 14, i denotes $\sqrt{-1}$, and $\phi_y$ and $\phi_z$ denote the phase shift of the signal in the Y- and Z-axis directions, respectively. $L_y$ and $L_z$ are the length of the imaging aperture in the Y- and Z-axis directions, respectively.

In FIG. 2, each pulse sequence produces only one contribution $k_y,k_z$ and thus $n_y \cdot n_z$ such sequences must be used. This takes time $n_y \cdot n_z \tau$, where $\tau$ is the time between pulse sequences (typically 0.05 sec to 1 sec). If on the other hand, there are m echoes per excitation, then it is only necessary to perform $n_y \cdot n_z/m$ such sequences to get the full spatial imaging information.

An example of a sequence which gathers all the required imaging information is as follows. In the first excitation, a gradient pulse $G_z$ is applied in interval 4 which includes a rephasing component $G_{z1}(t)$, and a phase encoding component $G_{z2}(t)$ such that $$\gamma L_z \int_4 dt G_{z2}(t) = -2\pi \cdot \frac{n_z}{2} \quad (15)$$

$\gamma$ is the gyromagnetic ratio. Also in interval 4 is a phase encoding y gradient $G_y(t)$ such that $$\gamma L_y \int_4 dt G_y(t) = -2\pi \cdot \frac{n_y}{2} \quad (16)$$

In subsequent intervals 6, 8, and so on, additional $G_y$ gradient pulses are applied such that $$\gamma L_y \int_6 dtG_y(t) = \gamma L_y \int_8 dtG_y(t) = \gamma L_y \int_{10} dtG_y(t) = \ldots = 2\pi \quad (17)$$

In this example, no additional $G_z$ gradient pulses are applied. It should be noted that the phase twists along the Y-axis for the multiple echoes are cumulative, i.e., after j of the additional gradient pulses, the total shift $\Delta\phi$ between the extreme ends of the imaging aperture in the Y-axis direction is given by $$\Delta\phi = -2\pi \frac{n_y}{2} + 2\pi j \quad (18)$$

If $n_y$ echoes can be obtained, then the next excitation sequence is identical to the first except that the first $G_{z2}(t)$ is chosen to satisfy the condition $$\gamma L_z \int_4 dtG_{z2}(t) = \left(-\frac{n_z}{2} + 1\right) 2\pi \quad (19)$$

and $n_z$ such sequences are then obtained to complete the gathering of the spatial information.

FIG. 6 is a pulse sequence similar to that of FIG. 5 except that 180° RF pulses are applied in intervals 6, 8, etc., to produce the spin echo signals in intervals 5, 7, etc., respectively. The use of the 180° RF pulses is desirable because (as explained with reference to FIG. 4) such pulse sequences overcome $T_2^*$ effects due to inhomogeneities in the static magnetic field $B_o$, whereas reversing the $G_x$ gradient (FIG. 5) does not. As in FIG. 4, the $G_x$ gradient pulses must satisfy the condition $$\int_{t_5}^{t_6} dtG_x = \int_{t_6}^{t_7} dtG_x, \int_{t_7}^{t_8} dtG_x = \int_{t_8}^{t_9} dtG_x \ldots \text{etc.}$$

It should be evident that there are a large number of choices of $G_y$ and $G_z$ pulses which can be used to produce the complete set of spatial information, including additional $G_z$ pulses in intervals 6, 8. 10, etc., of FIGS. 5 and 6. The only requirement is that all pairs of total phase shift, $(\Delta\phi_y, \Delta\phi_z)$, produced by the $G_y$ and $G_z$ pulses satisfy $(\Delta\phi_y, \Delta\phi_z) = 2\pi(k_y, k_z)$, where $$k_y = -n_y/2, -n/2+1, \ldots, n_y/2-1,$$

and $$k_z = -n_z/2, -n_z/2+1, \ldots, n_z/2-1,$$

are used in at least one signal.

Figure 7:
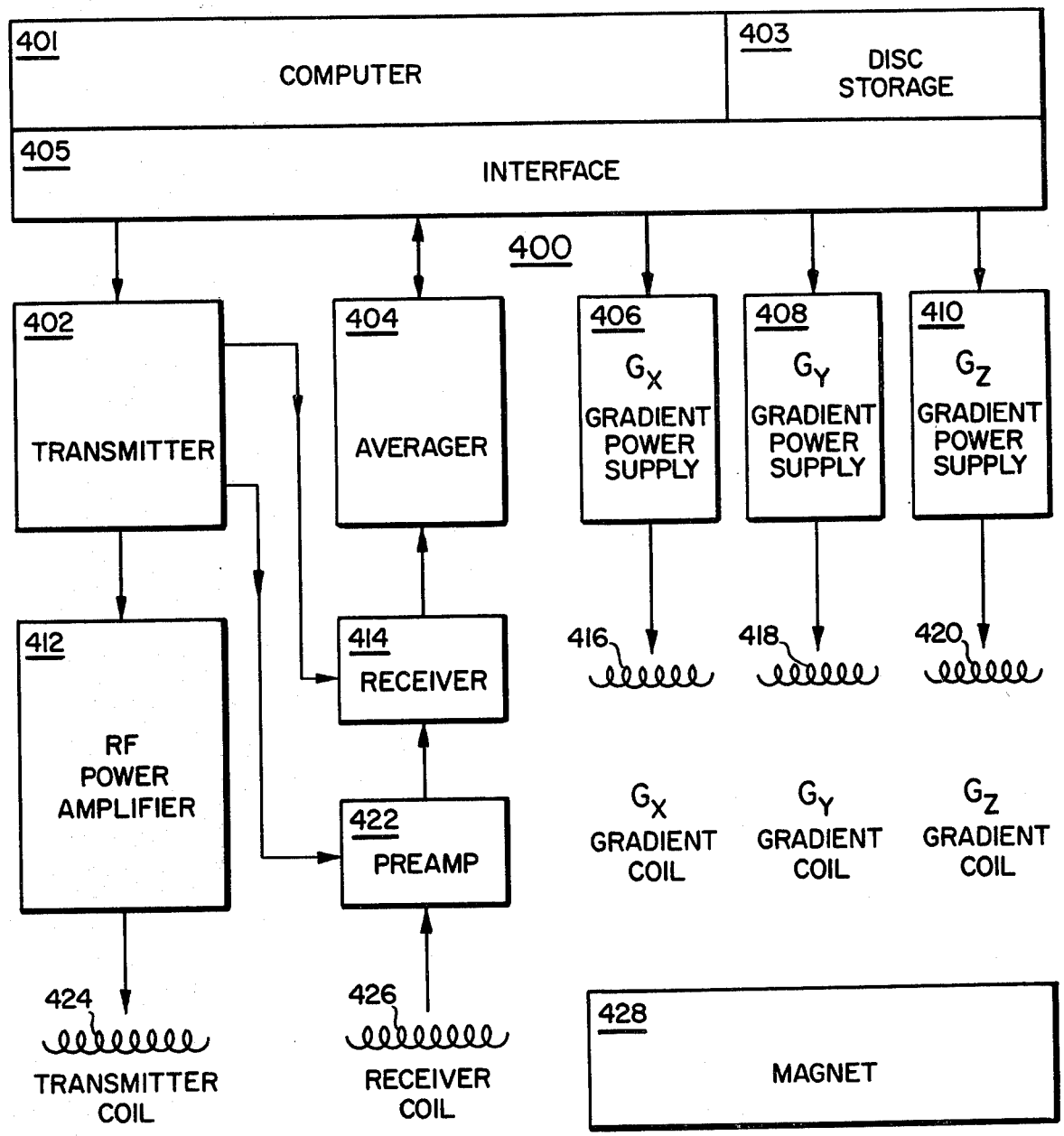
FIG. 7 illustrates a simplified block diagram of the major components of an NMR imaging apparatus suitable for producing the NMR pulse sequences shown in FIGS. 2, 4, 5, and 6.

FIG. 7 is a simplified block diagram of the major components of an NMR imaging system suitable for use with the NMR pulse sequences of the invention described herein. The system, generally designated 400, is made up of a general purpose mini-computer 401 which is functionally coupled to disk storage unit 403 and an interface unit 405. An RF transmitter 402, signal averager 404, and gradient power supplies 406, 408, and 410 for energizing, respectively, x, y, z gradient coils 416, 418, and 420 are coupled to computer 401 throgh interface unit 405.

RF transmitter 402 is gated with pulse envelopes from computer 401 to generate RF pulses having the required modulation to excite nuclear resonance in the object under study. The RF pulses are amplified in RF power amplifier 412 to levels varying from 100 watts to several kilowatts, depending on the imaging method, and applied to transmitter coil 424. The higher power levels are necessary for large sample volumes such as in whole body imaging, and where short duration pulses are required to excite large NMR frequency bandwidths.

The NMR signal is sensed by receiver coil 426, amplified in a low noise preamplifier 422, and applied for further amplification, detection, and filtering to receiver 414. The signal is then digitized for averaging by signal averager 404 and for precessing by computer 401. Preamplifier 422 and receiver 414 are protected from the RF pulses during transmission by active gating or by passive filtering.

Computer 401 provides gating and envelope modulation for the NMR pulses, blanking for the preamplifier and RF power amplifier, and voltage waveforms for the gradient power supplies. The computer also performs data processing such as Fourier transforms, image reconstruction, data filtering, imaging display, and storage functions (all of which are beyond the scope of the present invention).

Figure 8A:
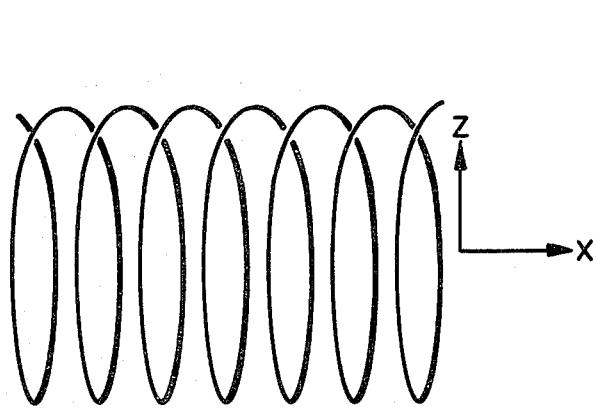
FIG. 8a illustrates an RF coil design for use with geometries for which the sample chamber is perpendicular to the static magnetic field.
Figure 8B:
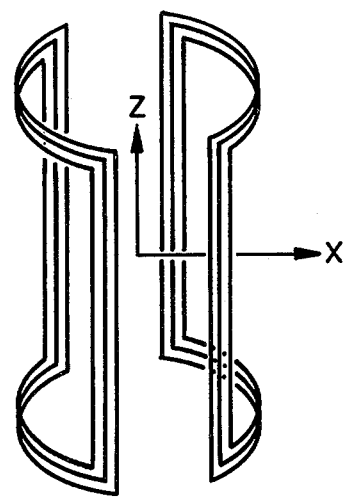
FIGS. 8b and 8c illustrate RF coil designs suitable for magnetic geometries for which the axis of the sample chamber is parallel to the static magnetic field.
Figure 8C:
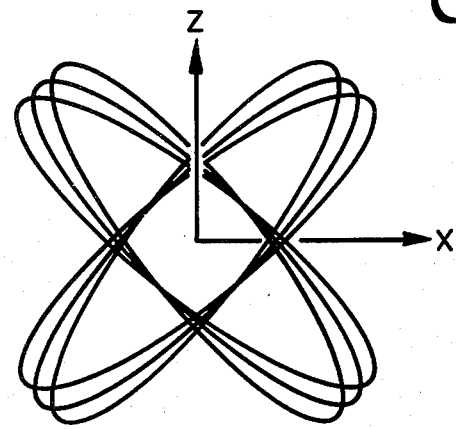

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the coils are orthogonal to the direction of the static magnetic field $B_o$ produced by magnet 428 (FIG. 7). The coils are isolated from the remainder of the system by enclosure in an RF shielded cage. Three typical RF coil designs are illustrated in FIGS. 8a, 8b, and 8c. All of these coils produce RF magnetic fields in the x direction. The coil designs illustrated in FIGS. 8b and 8c are suitable for magnetic geometries for which the axis of the sample chamber is parallel to the main field $B_o$ (FIG. 1). The design illustrated in FIG. 8a is applicable to geometries for which the sample chamber axis is perpendicular to the main field $B_o$ (not shown).

Magnetic field gradient coils 416, 418, and 420 (FIG. 7) are necessary to provide gradients $G_x$, $G_y$, and $G_z$, respectively. In the imaging pulse sequences described herein, the gradients should be monotonic and linear over the sample volume. Multivalued gradient fields cause a degradation in the NMR signal data, known as aliasing, which leads to severe image artifacts. Nonlinear gradients cause geometric distortions of the image.

Figure 9A:
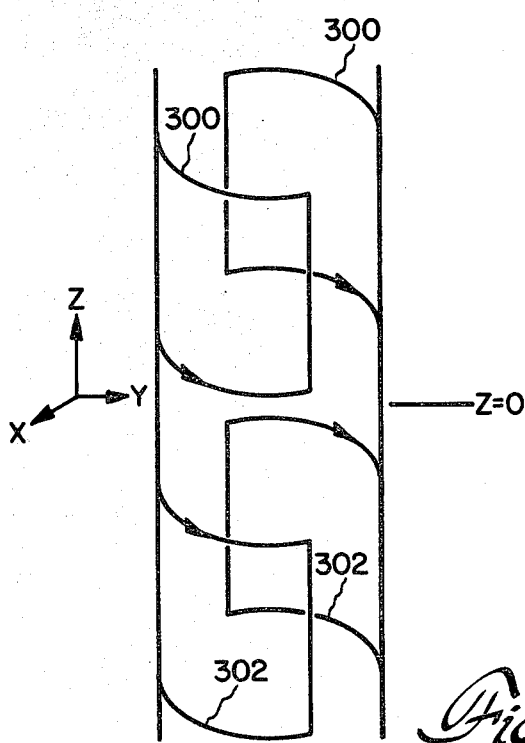
FIG. 9a illustrates two sets of coils suitable for producing $G_x$ and $G_y$ gradients.
Figure 9B:
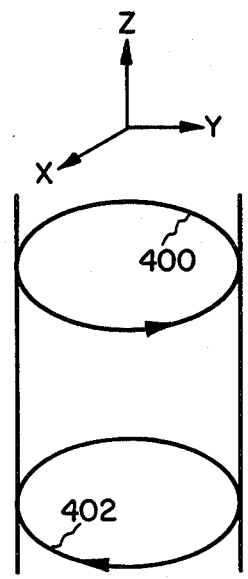
FIG. 9b depicts a coil configuration suitable for producing a $G_z$ gradient.

A design for gradient coils suitable for magnet geometries with a sample chamber axis parallel to the main field $B_o$ is depicted in FIGS. 9a and 9b. Each of gradients $G_x$ and $G_y$ is produced by a set of coils such as sets 300 and 302 depicted in FIG. 9a. The coil sets as illustrated in FIG. 9a produce gradient $G_x$. The coil sets for producing gradient $G_y$ are rotated 90° around the cylindrical axis 106 (FIG. 1) of the sample chamber relative to the coil that produces gradient $G_x$. The z gradient is generated by a coil pair such as coils 400 and 402 shown in FIG. 9b.

From the foregoing, it will be apparent that the NMR pulse sequences in accordance with the invention provide an improved three-dimensional imaging method in which imaging information is obtained simultaneously from a selected and controlled volume of an NMR imaging sample. The pulse sequences permit the time necessary for information gathering and reconstruction processes to be shortened. Since the size of the volume to be imaged is controllably selected, the dynamic range can be maintained within the limits of the electronic imaging system.

While this invention has been and described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method of three-dimensional NMR imaging in which selective excitation is used to excite a thick planar slab of nuclear spins in an imaging sample situated in a static magnetic field and in which the necessary imaging information for constructing a series of tomographic section images of said thick planar slab is collected simultaneously from throughout said thick planar slab, said method comprising the steps of:
 a. applying for a first predetermined time interval a magnetic field gradient along a first axis of said imaging sample;
 b. irradiating said imaging sample, during said first time interval, with a frequency selective RF pulse so as to excite a plurality of nuclear spins in said thick planar slab of said imaging sample such that said thick planar slab is selected to be situated within the region over which the receiver coil for detecting NMR signals is sensitive;
 c. applying during a second predetermined time interval, subsequent to said first time interval:
  (1) a first magnetic field gradient directed along said first axis for phase encoding nuclear spin spatial distribution information along said first axis, said first magnetic field gradient having a predetermined amplitude selected from $n_z$ different amplitudes, wherein $n_z$ is equal to the number of said tomographic section images,
  (2) a second magnetic field gradient directed along a second axis of said imaging sample for dephasing said excited nuclear spins, and
  (3) a third magnetic field gradient directed along a third axis of said imaging sample, said third axis being orthogonal to said second axis, for phase encoding nuclear spin spatial information along said third axis, said third magnetic field gradient having a predetermined amplitude selected from $n_y$ different amplitudes, wherein $n_y$ is equal to the number of pixels in one of said tomographic section images along said third axis;
 d. applying, during a third predetermined time interval, subsequent to said second time interval, a rephasing magnetic field gradient having the same direction as said second magnetic field gradient, so as to rephase said nuclear spins dephased during said second time interval to produce a spin echo signal, the Fourier transform of which is a projection of nuclear spin spatial distribution information from throughout said thick planar slab onto said second axis;
 e. sampling said spin echo signal $n_x$ times in the presence of said rephasing magnetic field gradient, wherein $n_x$ is equal to the number of pixels in one of said tomographic section images along said second axis;
 f. repeating the preceding steps for $n_y$ different amplitudes of said third magnetic field gradient; and
 g. repeating the preceding steps for $n_z$ different amplitudes of said first magnetic field gradient.

2. The method of claim 1 wherein said first magnetic field gradient comprises a first component for rephasing said excited nuclear spins and a second component for phase encoding spatial information in the direction of said first axis.

3. The method of claim 1 further comprising the steps of:
 alternately reversing the polarity of said rephasing magnetic field gradient in subsequent time intervals after said third interval so as to produce a plurality of spin echo signals; and
 summing said spin echo signals, after time-reversing alternate spin echo signals, to improve the signal-to-noise ratio thereof.

4. The method of claim 1 further comprising the step of irradiating said thick planar slab with a 180° RF nonselective pulse at between about 0.03 and about 3 seconds prior to step (a), such that said spin echo signal contains spatial information of the distributions of nuclear spin density and $T_1$ in said thick planar slab.

5. The method of claim 1 further comprising the step of inverting said excited nuclear spins by an adiabatic fast passage prior to step (a), such that said spin echo signal contains spatial information of the distributions of nuclear spin density and $T_1$ in said thick planar slab.

6. The method of claim 4 or 5 further comprising the step of repeating said steps a–g, including the respective steps of irradiating said thick planar slab with said 180° RF pulse and inverting said excited nuclear spins, at a repetition period of between 0.03 and 3 seconds, such that said spin echo signal contains spatial information of the distribution of $T_1$ in said thick planar slab.

7. The method of claim 1 further comprising the step of repeating steps a–g at a repetition period of between 0.03 and 3 seconds, such that said spin echo signal contains spatial information of the distributions of nuclear spin density and $T_1$ in said thick planar slab.

8. The method of claim 1, 3, 4, or 5 wherein said frequency selective pulse comprises a carrier modulated by $(\sin bt)/bt$, wherein b is a constant and t is time.

9. The method of one of claim 8 wherein said selective RF pulse comprises a selective 90° RF pulse.

10. The method of claim 9 wherein said thick planar slab is situated orthogonal to said first axis of said sample.

11. A method for three-dimensional NMR image formation which overcomes the effects of inherent static magnetic field inhomogeneity on nuclear spin echo formation and in which the necessary imaging information for constructing a series of tomographic section images of a thick planar slab of an imaging sample is collected simultaneously from throughout the thick planar slab, said method comprising the steps of:
 a. maintaining a static magnetic field along a first axis of said imaging sample;
 b. applying for a first predetermined time interval a magnetic field gradient along said first axis of said imaging sample;
 c. irradiating said imaging sample, during said first time interval, with a frequency selective RF pulse so as to excite a plurality of nuclear spins in said thick planar slab of said imaging sample such that said thick planar slab is selected to be situated within the region over which the receiver coil for detecting NMR signals is sensitive;

d. applying during a second predetermined time interval, subsequent to said first time interval:
   (1) a first magnetic field gradient directed along said first axis for phase encoding nuclear spin spatial distribution information along said first axis, said first magnetic field gradient having a predetermined amplitude selected from $n_z$ different amplitudes, wherein $n_z$ is equal to the number of said tomographic section images,
   (2) a second magnetic field gradient directed along a second axis of said imaging sample for dephasing said excited nuclear spins, said dephasing being in addition to nuclear spin dephasing induced by inherent inhomogeneities in said static magnetic field, and
   (3) a third magnetic field gradient directed along a third axis of said imaging sample, said third axis being orthogonal to said second axis, for phase encoding nuclear spin spatial distribution information along said third axis, said third magnetic field gradient having a predetermined amplitude selected from $n_y$ different amplitudes, werein $n_y$ is equal to the number of pixels in one of said tomographic section images along said third axis;

e. irradiating said image sample, after a time interval $\tau_a$ subsequent to the mean occurrence of said frequency selective RF pulse, with a first 180° RF pulse so as to initiate the rephasing of said excited nuclear spins;

f. applying during a third predetermined time interval, subsequent to said second time interval, a rephasing magnetic field gradient having the same direction as said second magnetic field gradient such that, after a time interval $\tau_a$ following said 180° RF pulse, the nuclear spin echo caused by rephasing of the nuclear spins dephased by said second magnetic field gradient coincides with the occurrence of the nuclear spin echo derived from the rephasing of the nuclear spins dephased by the inherent inhomogeneities in said static magnetic field, said nuclear spin echoes producing a composite NMR signal, the Fourier transform of which is a projection of nuclear spin spatial distribution information from throughout said thick planar slab onto said second axis;

g. sampling said composite NMR signal $n_x$ times, wherein $n_x$ is equal to the number of pixels in said tomographic section image along said second axis;

h. repeating steps (b-g) for $n_y$ different amplitudes of said third magnetic field gradient; and i. repeating steps (b-h) for $n_z$ different amplitudes of said first magnetic field gradient.

12. The method of claim 11 wherein said first magnetic field gradient comprises a first component for rephasing said excited nuclear spins and a second component for phase encoding spatial information in the direction of said first axis.

13. The method of claim 11 further comprising the step of repeating said first 180° RF pulse a plurality of times in subsequent time intervals, after said third time interval, so as to produce a corresponding plurality of spin echo signals; and
   summing said spin echo signals, after time-reversing alternate spin echo signals, to improve the signal-to-noise ratio thereof.

14. The method of claim 11 further comprising the step of irradiating said thick planar slab with a second 180° RF nonselective pulse at between about 0.03 and about 3 seconds prior to step (b), such that said composite NMR signal contains spatial information of the distributions of nuclear spin density and $T_1$ in said thick planar slab.

15. The method of claim 11 further comprising the step of inverting said excited nuclear spins by an adiabatic fast passage prior to step (b), such that said composite NMR signal contains spatial information of the distributions of nuclear spin density and $T_1$ in said thick planar slab.

16. The method of claim 14 or 15 further comprising the step of repeating said steps (b-i), including the respective steps of irradiating said thick planar slab with said second 180° RF pulse and inverting said excited nuclear spins, at a repetition period of between about 0.03 and about 3 seconds such that said composite NMR signal contains spatial information of $T_1$ in said thick planar slab.

17. The method of claim 16 wherein said time interval $\tau_a$ between said frequency selective RF pulse in step (c) and said first 180° RF pulse in step (e) is selected from a range of between about 2 and about 1500 milliseconds, such that said composite NMR signal contains spatial distribution of $T_1$ and $T_2$ in said thick planar slab.

18. The method of claim 14 or 15 wherein said time interval $\tau_a$ between said frequency selective RF pulse in step (c) and said first 180° RF pulse in step (e) is selected from a range of between about 2 and about 1500 milliseconds, such that said composite NMR signal contains spatial distribution information of $T_1$ and $T_2$ in said thick planar slab.

19. The method of claim 11 further comprising the step of repeating steps (b-i) at a repetition period of between 0.03 and 3 seconds, such that said spin echo signal contains spatial information of the distributions of nuclear spin density and $T_1$ in said planar slab.

20. The method of claim 11 wherein said time interval $\tau_a$ between said frequency selective RF pulse in step (c) and said first 180° RF pulse in step (e) is selected from a range of between about 2 and about 1500 milliseconds, such that said composite NMR signal contains spatial information of the distribution of $T_2$ in said thick planar slab.

21. The method of claim 20 further comprising the step of repeating said steps (b-i), including the respective steps of selecting $\tau_a$ at a repetition period of between about 0.03 and about 3 seconds, such that said composite NMR signal contains spatial distribution information of $T_1$ and $T_2$ in said thick planar slab.

22. The method of claim 11, 14, or 15 wherein the integral of the waveform of said second gradient with respect to time over said first time interval is selected to be equal to the integral of the waveform of said rephasing gradient with respect to time over a time interval equal to said time interval $\tau_a$.

23. The method of claim 22 wherein said frequency selective pulse comprises a carrier modulated by (sin bt)/bt, wherein b is a constant and t is time.

24. The method of one of claim 23 wherein said selective RF pulse comprises a selective 90° RF pulse.

25. The method of claim 24 wherein said thick planar slab is situated orthogonal to said first axis of said sample.

26. A method of three-dimensional NMR imaging in which selective excitation is used to excite a thick planar slab of nuclear spins in an imaging sample situated in a static magnetic field and in which the necessary imaging information for constructing a series of tomographic section images of said thick planar slab is collected simultaneously from throughout said thick planar slab, said method comprising the steps of:

a. applying for a first predetermined time interval a magnetic field gradient along a first axis, corresponding to the Z-axis of a Cartesian coordinate system, of said imaging sample;

b. irradiating said imaging sample, during said first time interval, with a frequency selective RF pulse so as to excite a plurality of nuclear spins in said thick planar slab of said imaging sample, such that said thick planar slab is selected to be situated within the region over which the receiver coil for detecting NMR signals is sesnitive;

c. applying during a second predetermined time interval, subsequent to said first time interval:
  (1) a first magnetic field gradient directed along said first axis for phase encoding nuclear spin spatial distribution information along said first axis, said first magnetic field gradient having a predetermined amplitude selected from $n_z$ different amplitudes, wherein $n_z$ is equal to the number of said tomographic section images,
  (2) a second magnetic field gradient directed along a second axis of said imaging sample, corresponding to the X-axis of the Cartesian coordinate system, for dephasing said excited nuclear spins, and
  (3) a third magnetic field gradient directed along a third axis of said imaging sample, corresponding to the Y-axis of the Cartesian coordinate system, for phase encoding nuclear spin spatial distribution information along said third axis, said third magnetic field gradient having a predetermined amplitude selected from $n_y$ different amplitudes, wherein $n_y$ is equal to the number of pixels in one of said tomographic section images along said third axis;

d. applying, during a third predetermined time interval, subsequent to said second time interval, a rephasing magnetic field gradient, having the same direction as said second magnetic field gradient, so as to rephase said nuclear spins dephased during said second time interval to produce a spin echo signal which is a projection of nuclear spin spatial distribution information from throughout said thick planar slab onto said second axis; and e. sampling said spin echo signal $n_x$ times in the presence of said rephasing magnetic field gradient, wherein $n_x$ is equal to the number of pixels in one of said tomographic section images along said second axis;

wherein said first, third, and rephasing magnetic field gradients are selected so as to produce $(n_y)\cdot(n_z)$ NMR signals which upon Fourier analysis yield $(n_x)\cdot(n_y)\cdot(n_z)$ pixels, each of said NMR signals corresponding to a unique pair of integers, $k_y$ and $k_z$, selected such that $$-n_y/2 \leq k_y \leq n_y/2 - 1, \quad -n_z/2 \leq k_z \leq n_z/2 - 1$$

and wherein the NMR signal $S(x,y,z,k_y,k_z,t)$ originating from said thick planar slab at point $(x,y,z)$ is defined by $$S(x,y,z,k_y,k_z,t) = S(x,y,z,0,0,t) \exp i\,\phi_y \exp i\,\phi_z$$

wherein $\phi_y$ and $\phi_z$ are the phase shifts of each NMR signal in the Y- and Z-axis directions, respectively, and are defined by $$\phi_y = \frac{2\pi k_y y}{L_y}, \quad \phi_z = \frac{2\pi k_z z}{L_z},$$

where $i = \sqrt{-1}$, t is time, and $L_y$ and $L_z$ are the lengths of the imaging aperture in the direction of the Y- and Z-axis, respectively.

27. The method of claim 26 wherein said frequency selective pulse comprises a carrier modulated by (sin bt)/bt, wherein b is a constant and t is time.

28. The method of claim 27 wherein said selective RF pulse comprises a selective 90° RF pulse.

29. The method of claim 28 wherein said thick planar slab is orthogonal to said first axis of said imaging sample.

* * * * *